United States Patent
Yamashiro

(10) Patent No.: US 11,004,807 B2
(45) Date of Patent: May 11, 2021

(54) METHOD OF PRODUCING LAMINATED SUBSTRATE, METHOD OF PRODUCING SEMICONDUCTOR MODULE, LAMINATED SUBSTRATE, AND SEMICONDUCTOR MODULE

(71) Applicant: FUJI ELECTRIC CO., LTD., Kawasaki (JP)

(72) Inventor: Keisuke Yamashiro, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/459,532

(22) Filed: Jul. 1, 2019

(65) Prior Publication Data
US 2020/0043872 A1 Feb. 6, 2020

(30) Foreign Application Priority Data
Aug. 3, 2018 (JP) .............................. JP2018-146412

(51) Int. Cl.
*H01L 23/62* (2006.01)
*H01L 21/48* (2006.01)
(Continued)

(52) U.S. Cl.
CPC .......... *H01L 23/62* (2013.01); *H01L 21/4882* (2013.01); *H01L 23/043* (2013.01); *H01L 23/3735* (2013.01); *H01L 24/32* (2013.01); *H01L 25/072* (2013.01); *H01L 2224/32225* (2013.01); *H01L 2924/10253* (2013.01); *H01L 2924/10272* (2013.01);
(Continued)

(58) Field of Classification Search
CPC . H01L 23/5254; H01L 23/62; H01L 23/3735; H01L 23/043; H01L 23/053; H01L 21/4882; H01L 25/072; H01L 24/32; H01L 2224/32225
See application file for complete search history.

(56) References Cited

U.S. PATENT DOCUMENTS

| | | | | |
|---|---|---|---|---|
| 6,504,110 B1 * | 1/2003 | Kusukawa | ........... | H05K 1/0257 174/261 |
| 2014/0290985 A1 * | 10/2014 | Dohn | .................. | C23C 18/1608 174/251 |
| 2016/0005514 A1 * | 1/2016 | Kuo | .................... | C23C 18/1868 427/554 |

FOREIGN PATENT DOCUMENTS

| | | | |
|---|---|---|---|
| JP | 63283104 A | * | 11/1988 |
| JP | 2002076190 A | | 3/2002 |

(Continued)

OTHER PUBLICATIONS

Machine English Translation of JP 63283104 A, pp. 1-2. (Year: 2020).*

*Primary Examiner* — Jose R Diaz
(74) *Attorney, Agent, or Firm* — Rabin & Berdo, P.C.

(57) ABSTRACT

A method of manufacturing a laminated substrate including an insulation substrate comprised of ceramic, and a front electrode formed on a front surface of the insulation substrate, a semiconductor element being mountable on a front surface of the front electrode, including forming the front electrode on the front surface of the insulation substrate, and before or after the forming the front electrode, applying laser processing to the front surface of the insulation substrate at an outer peripheral area of the front electrode to modify a conductive property of the front surface of the insulation substrate to have electrical conductivity.

12 Claims, 11 Drawing Sheets

(51) Int. Cl.
*H01L 23/373* (2006.01)
*H01L 23/043* (2006.01)
*H01L 25/07* (2006.01)
*H01L 23/00* (2006.01)

(52) U.S. Cl.
CPC ............... *H01L 2924/12032* (2013.01); *H01L 2924/13055* (2013.01); *H01L 2924/13091* (2013.01)

(56) References Cited

FOREIGN PATENT DOCUMENTS

| | | |
|---|---|---|
| JP | 2002076197 A | 3/2002 |
| JP | 2005116602 A | 4/2005 |

\* cited by examiner

METHOD OF PRODUCING LAMINATED SUBSTRATE, METHOD OF PRODUCING SEMICONDUCTOR MODULE, LAMINATED SUBSTRATE, AND SEMICONDUCTOR MODULE

CROSS REFERENCE TO RELATED APPLICATION

This application is based upon and claims the benefit of priority from the prior Japanese Patent Application No. 2018-146412, filed on Aug. 3, 2018; the entire contents of which are incorporated herein by reference.

FIELD OF THE INVENTION

The present disclosure is related to a method of producing a laminated substrate, a method of producing a semiconductor module, a laminated substrate, and a semiconductor module.

DESCRIPTION OF THE RELATED ART

A laminated substrate fora semiconductor module includes a ceramic substrate such as for example a substrate containing aluminum nitride (AlN), and an electrode provided on a surface of the ceramic substrate (see Patent Documents 1 through 3). A semiconductor element is mounted on a surface of the electrode.

PRIOR ART DOCUMENTS

Patent Documents

[Patent Document 1] Japanese Laid-open Patent Publication No. 2002-76197
[Patent Document 2] Japanese Laid-open Patent Publication No. 2002-76190
[Patent Document 3] Japanese Laid-open Patent Publication No. 2005-116602

SUMMARY

Incidentally, electric fields concentrate around an edge of an electrode. This often causes dielectric breakdown. Patent Documents 1 and 2 for example disclose a technique in which a solid insulator fills the space between an edge of an electrode and a surface of a ceramic substrate. This configuration is believed to increase the dielectric breakdown voltage.

However, many defects, known as pits, emerge around an edge of an electrode. This prevents the solid insulator from appropriately filling the defects, resulting in an insufficient dielectric breakdown voltage.

Patent Document 3 discloses a technique in which a ceramic substrate and an electrode have a junction layer between them. In the technique of Patent Document 3, the junction layer externally extends beyond the edge of the electrode. The surface of the externally extending portion of the junction layer is covered with a coating material.

However, the etching for forming the electrode has caused a defect on the surface of the externally extending portion of the junction layer. This prevents the coating material from appropriately filling the defect in the junction layer, resulting in an insufficient dielectric breakdown voltage.

Further, the solid insulators and the coating materials appearing in the above Patent Documents may peel off. These approaches based on the above Patent Documents fail to provide sufficient reliability for semiconductor modules that are produced by using laminated substrates described in these Patent Documents.

In view of this problem, it is an object of the present disclosure to provide a method of producing a laminated substrate and a laminated substrate that can achieve a higher dielectric breakdown voltage easily and stably and to provide a method of producing a semiconductor module and a semiconductor module that can achieve higher reliability.

A method, according to an aspect of the present disclosure, of producing a laminated substrate is a method of producing a laminated substrate that includes an insulation substrate, comprising ceramic, and an electrode formed on a top surface (front surface) of the insulation substrate and that permits a semiconductor element to be mounted on the top surface (front surface) of the electrode, the method including applying laser processing to an outer periphery of the electrode on the top surface of the insulation substrate so as to conduct surface modification to modify the outer periphery to have electrical conductivity.

A laminated substrate according to an aspect of the present disclosure is a laminated substrate that includes an insulation substrate, comprising ceramic, and an electrode formed on a top surface of the insulation substrate and that permits a semiconductor element to be mounted on the top surface of the electrode, the laminated substrate including a surface-modified region whose principal component is a metal or an alloy made of metal elements constituting the ceramic, the surface-modified region being located on an outer periphery of the electrode on the top surface of the insulation substrate.

The method of producing a laminated substrate according to the present disclosure realizes stable production of a laminated substrate having a high dielectric breakdown voltage through a simple scheme. This permits production of highly-reliable semiconductor modules.

The laminated substrate according to the present disclosure can achieve a higher dielectric breakdown voltage in a stable manner. Thereby, highly-reliable semiconductor modules can be provided.

DESCRIPTION OF EMBODIMENTS

Figure 1A:
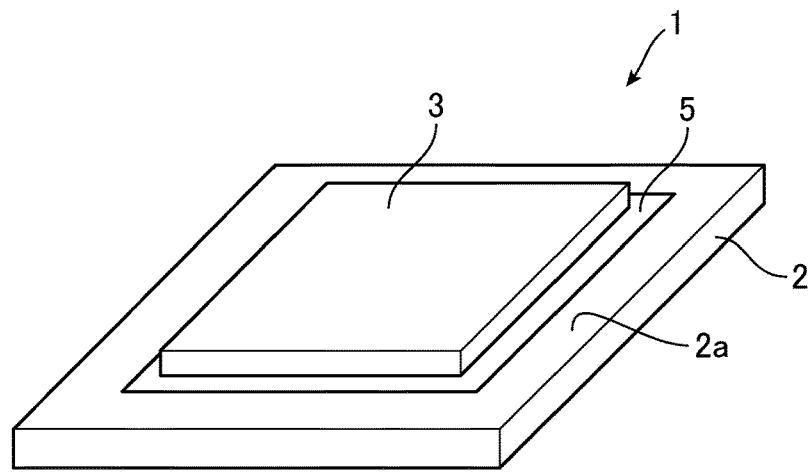
FIG. 1A is a perspective view illustrating a laminated substrate of a first embodiment.
Figure 1B:
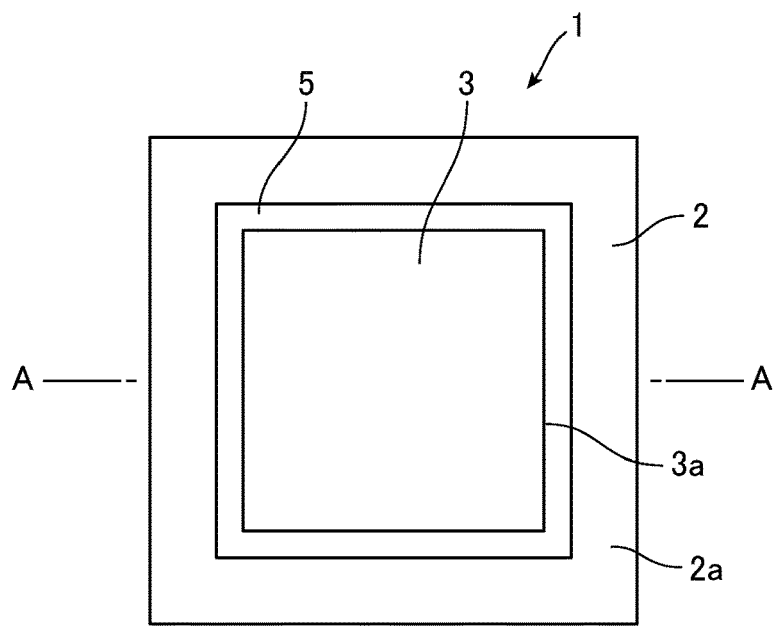
FIG. 1B is a plan view illustrating the laminated substrate of the first embodiment.
Figure 1C:
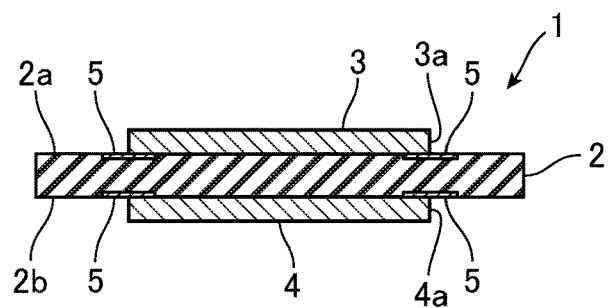
FIG. 1C is a cut-portion end view illustrating the laminated substrate of the first embodiment.

The following will explain a laminated substrate of a first embodiment. FIG. 1A is a perspective view of the laminated substrate of the first embodiment. FIG. 1B is a plan view of the same laminated substrate. FIG. 1C is a cut-portion end view of the same laminated substrate. The cut-portion end view of FIG. 1C illustrates the end surface resulting from cutting the laminated substrate along line A-A of FIG. 1B. FIG. 1A through FIG. 1C will be referred to for explaining the components constituting the laminated substrate as well as a method of producing the laminated substrate, particularly, laser processing applied to the insulation substrate.

As illustrated in FIG. 1A through FIG. 1C, a laminated substrate 1 includes an insulation substrate 2 comprising ceramic, and electrodes 3 and 4 formed respectively on top surface (front surface) 2a and bottom surface (rear surface) 2b of the insulation substrate 2. The electrodes 3 and 4 respectively have areas smaller than those of the top and bottom surfaces 2a and 2b of the insulation substrate 2. The top and bottom surfaces 2a and 2b of the insulation substrate 2 have exposed portions on the outer peripheries of the electrodes 3 and 4. In this example, the electrode 3 formed on the top surface 2a of the insulation substrate 2 is a circuit board provided on the side of the semiconductor module on which a semiconductor element is to be mounted. The electrode 4 formed on the bottom surface 2b of the insulation substrate 2 is a metal plate on the base-plate side of the semiconductor module. Therefore, "the top surface 2a of the insulation substrate 2" refers to the surface on the side to have the electrode 3 formed as a circuit board on which a semiconductor element is mounted, and "the bottom surface 2b of the insulation substrate 2" refers to the surface on the side to have the electrode 4 serving as the metal plate on the base-plate side. Also, the top surface of the electrode 3 formed on the top surface 2a of the insulation substrate 2 is the surface on which a semiconductor element is to be mounted, and the bottom surface of the electrode 3 is a surface to be jointed to the insulation substrate 2. The top surface of the electrode 4 formed on the bottom surface 2b of the insulation substrate 2 is the surface on the side facing the base plate, and the bottom surface of the electrode 4 is the surface jointed to the insulation substrate 2. The electrodes 3 and 4 may contain copper (Cu) or aluminum (Al), both of which have excellent conductivity, or may contain a substance such as for example an alloy containing at least one of these materials. Also, the electrodes 3 and 4 may have their surfaces plated with nickel (Ni), gold (Au), etc.

The present embodiment applies laser processing to the outer periphery of the electrode 3 on the top surface 2a of the insulation substrate 2. The application of laser processing causes deposition, in the form of a metal or an alloy, of the ceramic-constituting metal element on the top surface 2a of the insulation substrate 2, which comprises ceramic, thereby modifying the portion to have electrical conductivity through surface modification. For the insulation substrate 2, the present embodiment may use substances such as oxide ceramic, nitride ceramic, carbide ceramic, and boride ceramic. For example, the present embodiment may use ceramic containing AlN as its principal component. When ceramic containing AlN as the principal component is used, desorption of nitrogen (N) and deposition of Al, which is a metal, occur on the top surface 2a of the insulation substrate 2, causing surface modification to electric conductivity on the top surface 2a. The "principal component" of the insulation substrate 2 refers to a component that accounts for more than fifty percent of the components constituting the insulation substrate 2 in terms of volume ratio. The region that has received the laser processing appears as a surface-modified region (front modified region) 5 in FIG. 1A through FIG. 1C. The surface-modified regions 5 of this embodiment have a shape of a rectangular frame. The "surface-modified region" refers to an electrically conductive or semi-conductive region containing, as its principal component, a metal or an alloy comprising metal elements that constitute ceramic. The "principal component" of the surface-modified region 5 refers to a component that accounts for more than fifty percent of the components constituting the surface-modified region 5 in terms of volume ratio. Note that the surface-modified region 5 and the insulation substrate 2 do not have to have a clear boundary between them, and the ratio of the metal element may gradually increase with decreasing distance to the surface-modified region 5 starting from the insulation substrate 2. As described above, the top surface 2a of the insulation substrate 2 of the present embodiment mixedly includes an insulation region and a conductive/semi-conductive region.

Although the present embodiment can use any types of laser, examples of such laser may include carbon dioxide laser, YAG laser, fiber laser, and excimer laser.

The present embodiment forms, through laser processing, the conductive surface-modified region 5 also on the outer periphery of the electrode 4, which is formed on the bottom surface 2b of the insulation substrate 2. The "outer periphery of electrode" refers to a periphery that is outer than edges (outer surfaces) 3a and 4a of the electrodes 3 and 4. Also, present embodiment forms the surface-modified regions 5 entirely on the peripheries with a prescribed width outer than the edges 3a and 4a of the electrodes 3 and 4. However, the surface-modified region 5 may be formed only partially on the periphery.

The surface-modified regions 5 of the first embodiment, which are formed on the top and bottom surfaces 2a and 2b, respectively start from the outer peripheries of the electrodes 3 and 4 and reach the bottom surfaces of the electrodes 3 and 4 as illustrated in FIG. 1C. This permits electrical connection between the surface-modified regions 5 and the electrodes 3 and 4.

Figure 2A:
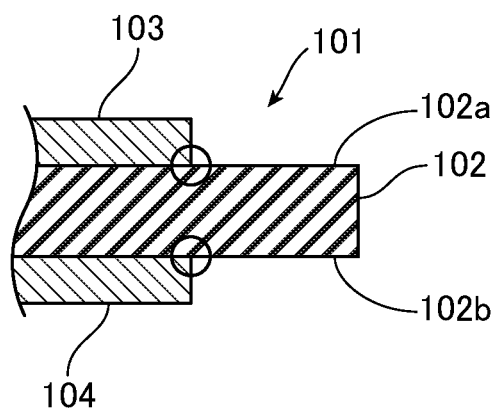
FIG. 2A is a partial cut-portion end view illustrating a triple point on a laminated substrate of a comparison example.
Figure 2B:
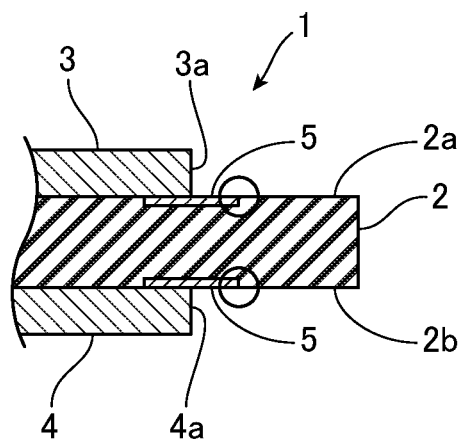
FIG. 2B is a partial cut-portion end view illustrating a triple point on the laminated substrate of the first embodiment.

FIG. 2A is a partial cut-portion end view illustrating a triple point on a laminated substrate of a comparison example. FIG. 2B is a partial cut-portion end view illustrating a triple point on the laminated substrate of the first embodiment. A laminated substrate 101 illustrated in FIG. 2A includes electrodes 103 and 104 respectively on top and bottom surfaces 102a and 102b of an insulation substrate 102 that contains for example AlN as its principal component. However, the top and bottom surfaces 102a and 102b of the insulation substrate 102 have not received laser processing on the outer peripheries of the electrodes 103 and 104 in FIG. 2A. This results in the top and bottom surfaces 102a and 102b of the insulation substrate 102 not having a conductive surface-modified region. The top surface, on which a semiconductor element is to be mounted, of the laminated substrate 101 may be covered with an encapsulation resin (not illustrated). The encapsulation resin can be used for sealing for example the top surface 102a and the electrode 103 of the insulation substrate 102. The encapsulation resin may use substances such as an epoxy resin and a silicone gel for its material. Also, the encapsulation resin may include an inorganic filler such as silicon oxide ($SiO_2$), aluminum oxide ($Al_2O_3$), etc. as an additive.

The circles in FIG. 2A indicate triple points, where three phases overlap. Ceramic, a metal, and a resin/gas constitute the three phases. The insulation substrate 102, the electrodes 103 and 104, and the encapsulation resin/atmosphere (not illustrated) constitute the three phases in FIG. 2A. Electric fields concentrate in the triple points. Additionally, the edges of the electrodes 103 and 104 have many defects in the form of dint, which are known as pits. This often causes dielectric breakdown to originate in triple points. The techniques of Patent Documents 1 and 2 apply solid insulators to spots around triple points to prevent dielectric breakdown. However, solid insulators cannot appropriately fill defects occurring at triple points. Further, solid insulators may sometimes peel off. This results in an insufficient dielectric breakdown voltage. This also increases the number of steps for providing solid insulators and the types of materials to be handled, also increasing the cost.

By contrast, laser processing is applied to the outer peripheries of the electrodes 3 and 4 on the top and bottom surfaces 2a and 2b of the insulation substrate 2 so as to modify the outer peripheries to have electrical conductivity in FIG. 2B. The surface-modified regions 5 are formed in such a manner that they span areas between the bottom surfaces of the electrodes 3 and 4 and peripheries outer than the edges of the electrodes 3 and 4 in FIG. 2B. This can outwardly shift the triple points, indicated by the circles, in a direction in which they get away from the edges 3a and 4a of the electrodes 3 and 4 that involve defects such as pits. In FIG. 2B, the circles indicate the triple points, where the three phases overlap. The insulation substrate 2, the surface-modified regions 5, and an encapsulation resin/atmosphere (not illustrated) constitute the three phases in this case. The triple points with concentrated electric fields can thereby be put at a longer distance from portions with defects, where dielectric breakdown may originate, thereby permitting stable increase of the dielectric breakdown voltage. The method of producing a laminated substrate according to the present embodiment realizes stable production of the laminated substrate 1 with a high dielectric breakdown voltage through a simple scheme of applying laser processing to the top and bottom surfaces 2a and 2b of the insulation substrate 2 without changing the encapsulation structure. Also, the surface modification reuses the laser used for cutting the insulation substrate 2, thereby reducing the cost. The laser processing applied for the surface modification employs lower output power that is suitable for modifying the top and bottom surfaces 2a and 2b of the insulation substrate 2 to have electrical conductivity through surface modification. For example, the output power used for the laser processing for the surface modification may be lower than that used for the laser processing for cutting the insulation substrate 2. Further, the laminated substrate of the present embodiment can achieve a higher breakdown voltage in a stable manner.

The surface-modified regions 5 of FIG. 2B are for example conductive regions containing Al as their principal component; however each of the surface-modified regions may be Al layer or may be layer containing a metal element other than Al or an element having an insulative property. Note that the "principal component" refers to the same subject as in the definition provided above. For example, the surface-modified region 5 may contain Al and AlON respectively for 60 and 40 percent by volume of the surface-modified region 5. The surface-modified region 5 may be a semi-conductive region containing an element having an insulative property in addition to a metal element such as Al. The semi-conductive surface-modified region 5 has a volume resistivity between that of the electrodes 3 and 4 and that of the insulation substrate 2. A semi-conductive surface-modified region 5 will decrease the electric potential, mitigating the concentration of electric fields in the triple point. This leads to more stable production of the laminated substrates 1 with a high dielectric breakdown voltage. As described above, the laser processing is performed under a condition regulated so that the surface-modified region 5 involves a remaining element with an insulation property and thus has a volume resistivity higher than that of the electrode, and thereby a semi-conductive surface-modified region 5 is obtained.

Figure 3A:
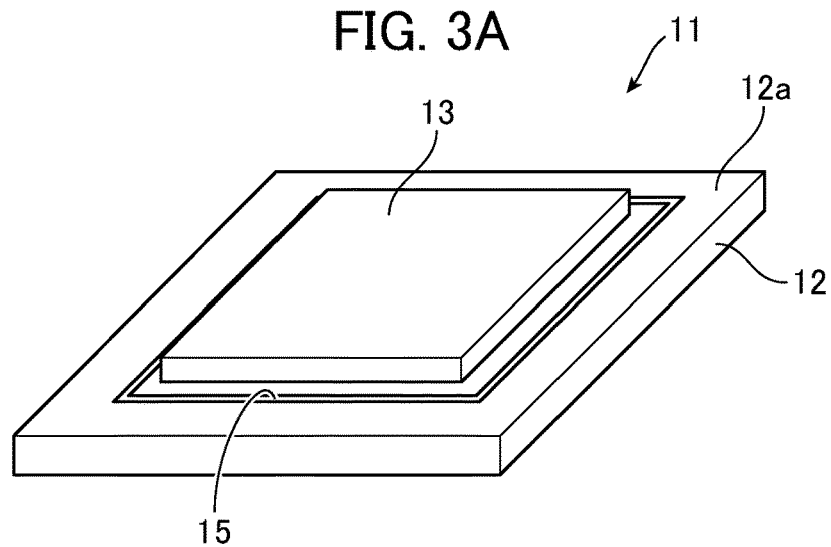
FIG. 3A is a perspective view illustrating a laminated substrate of a second embodiment.
Figure 3B:
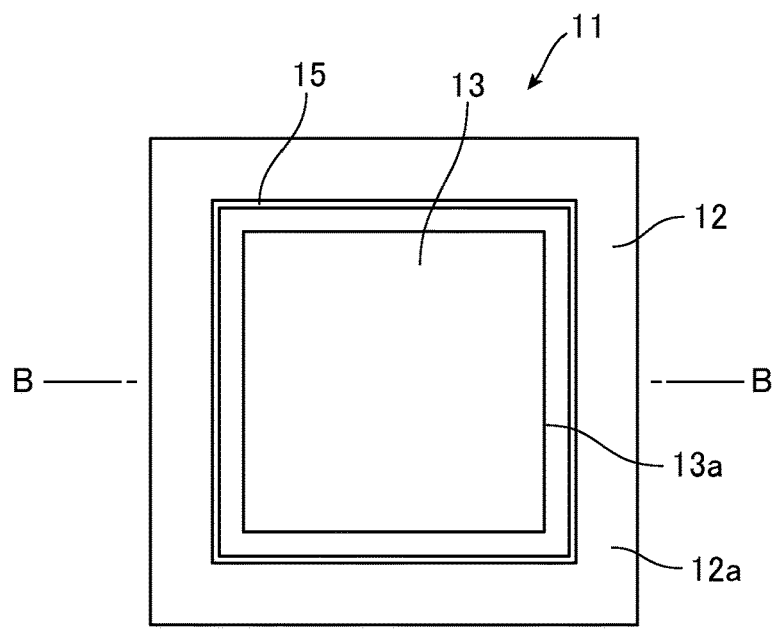
FIG. 3B is a plan view illustrating the laminated substrate of the second embodiment.
Figure 3C:
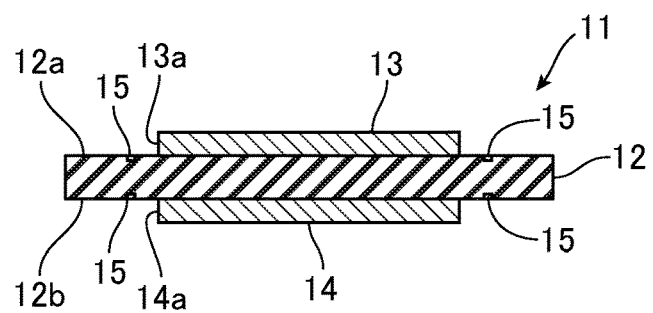
FIG. 3C is a cut-portion end view illustrating the laminated substrate of the second embodiment.

Next, a laminated substrate of a second embodiment will be explained. FIG. 3A is a perspective view of the laminated substrate of the second embodiment. FIG. 3B is a plan view of the same laminated substrate. FIG. 3C is a cut-portion end view of the same laminated substrate. The cut-portion end view of FIG. 3C illustrates the end surface resulting from cutting the laminated substrate along line B-B of FIG. 3B. FIG. 3A through FIG. 3C will be referred to for explaining the components constituting the laminated substrate as well as a method of producing the laminated substrate, particularly, the laser processing applied to the insulation substrate.

As illustrated in FIG. 3A through FIG. 3C, a laminated substrate 11 includes an insulation substrate 12 comprising ceramic, and electrodes 13 and 14 formed respectively on top and bottom surfaces 12a and 12b of the insulation substrate 12. The electrode 13 formed on the top surface 12a of the insulation substrate 12 is a circuit board provided on the side of the semiconductor module on which a semiconductor element is to be mounted. The electrode 14 formed on the bottom surface 12b of the insulation substrate 12 is a metal plate on the base-plate side of the semiconductor module. The "top surface" and the "bottom surface" refer respectively to the same portions as defined in the first embodiment.

As illustrated in FIG. 3A through FIG. 3C, laser processing is applied to the outer peripheries of the electrodes 13 and 14 on the top surface 12a and the bottom surface 12b of the insulation substrate 12 so as to modify the peripheries to have electrical conductivity through surface modification. In this surface modification, portions separated from the electrodes 13 and 14 on the top and bottom surfaces 12a and 12b receive the laser processing. The regions that have received the laser processing appear as surface-modified regions 15 in FIG. 3A through FIG. 3C. The surface-modified regions 15 of this embodiment have a shape of a rectangular frame. The surface-modified region 15 is, similarly to the surface-modified region 5 of the first embodiment, an electrically conductive or semi-conductive region containing, as its principal component, a metal or an alloy comprising metal elements that constitute ceramic. Also, the surface-modified region 15 uses the same material as the surface-modified region 5.

However, the second embodiment, illustrated in FIG. 3A through FIG. 3C, includes the surface-modified regions 15 that are not touching the electrode 13 or 14 and thus are not electrically connected to the electrode 13 or 14 unlike the first embodiment. Thereby, the conductive surface-modified regions 15 have floating potential. This can moderate the concentration of the electric fields in the triple points along the edges 13a and 14a of the electrodes 13 and 14, thereby leading to a higher dielectric breakdown voltage. The method of producing a laminated substrate according to the present embodiment realizes stable production of the laminated substrate 11 with a high dielectric breakdown voltage through a simple scheme of applying laser processing to the top and bottom surfaces 12a and 12b of the insulation substrate 12. Also, the surface modification reuses the laser used for cutting the insulation substrate 12, thereby reducing the cost. The laser processing applied to the surface modification uses lower output power that is suitable for modifying the top and bottom surfaces 12a and 12b of the insulation substrate 12 to have electrical conductivity. For example, the output power for the laser beam used for the modification may be lower than that for the laser beam used for cutting the insulation substrate 12. Further, the laminated substrate of the present embodiment can achieve a higher breakdown voltage in a stable manner.

Note that the surface-modified regions, appearing in FIG. 1A and FIG. 1B, and the surface-modified region 15, appearing in FIG. 3A and FIG. 3B, may be combined. In that case, the surface-modified region 5 and the surface-modified region 15 may also be formed partially, as will be described later. A portion with a lower dielectric breakdown voltage, in particular, may have two or more surface-modified regions, each enclosing inner ones, in order to achieve a higher dielectric breakdown voltage in a more stable manner.

While the surface-modified region 5 and the surface-modified region 15 have different widths respectively in FIGS. 1A and 1B and FIGS. 3A and 3B for the purpose of simplifying the illustration, they may have the same width. Note that the width of the surface-modified regions 5 and 15 is the width that receives laser irradiation, and a region may receive one time of laser irradiation over a width intended for the surface modification or may receive two or more times of laser irradiation over the intended width.

Figure 4A:
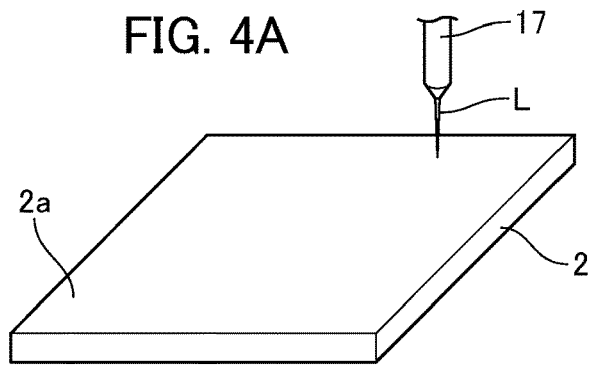
FIG. 4A is a perspective view illustrating steps of producing the laminated substrate of the first embodiment.
Figure 4B:
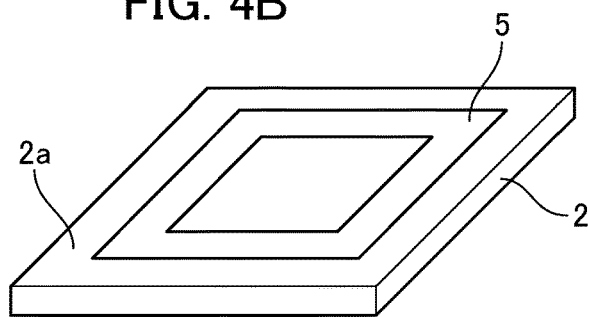
FIG. 4B is a perspective view illustrating the laminated-substrate-production steps subsequent to the steps of FIG. 4A.

Next, the method of producing the laminated substrate of the first embodiment will be explained in order of the steps. FIG. 4A through FIG. 4D are perspective views illustrating steps of producing the laminated substrate of the first embodiment. In FIG. 4A, a nozzle 17 of a laser irradiation device is set above the top surface 2a of the insulation substrate 2, which comprises ceramic, and the top surface 2a of the insulation substrate 2 is irradiated with laser L. As illustrated in FIG. 4B, the laser processing forms a surface-modified region 5 having a shape of a rectangular frame on the top surface 2a of the insulation substrate 2. Desorption of nitrogen (N) and deposition of Al for example occur on the top surface 2a of the insulation substrate 2, which has received the irradiation with laser L. Accordingly, the surface-modified region 5 has conductivity.

Figure 4C:
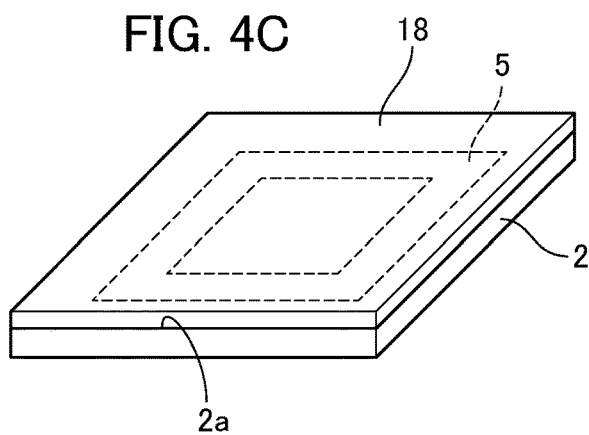
FIG. 4C is a perspective view illustrating the laminated-substrate-production steps subsequent to the steps of FIG. 4B.

In FIG. 4C, a metal plate 18 comprising a material for an electrode is jointed to the top surface 2a of the insulation substrate 2. The junction may employ an active brazing method, which uses a silver (Ag)-Copper (Cu) brazing material including an active metal such as titanium (Ti), zirconium (Zr), hafnium (Hf), etc. Alternatively, the junction may employ an oxidization direct bonding method, in which eutectic reaction between the metal plate 18 and oxygen is utilized to directly joint a copper plate to the top surface 2a of the insulation substrate 2 that has been oxidized beforehand. It is also possible to employ an aluminum direct bonding method for junction between, for example, the insulation substrate 2 using AlN as its principal component and the metal plate 18 using Al as its principal component.

Figure 4D:
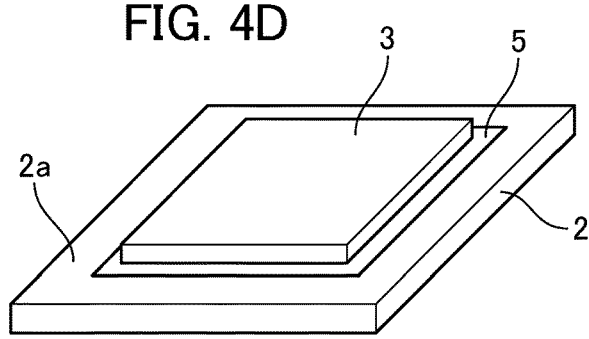
FIG. 4D is a perspective view illustrating the laminated-substrate-production steps subsequent to the steps of FIG. 4C.

In FIG. 4D, the metal plate 18 receives etching so as to form an electrode 3 in a prescribed shape. This results in the electrode 3 smaller than the top surface 2a of the insulation substrate 2. In doing so, the electrode 3 is formed in such a manner that the surface-modified region 5 is partially exposed on the outer periphery of the electrode 3. Note that the surface-modified region 5 partially reaches the bottom surface of the electrode 3 as explained in FIG. 1C.

While FIG. 4A through FIG. 4D illustrate the steps of forming the electrode 3 and the surface-modified region 5 on the top surface 2a of the insulation substrate 2, the electrode 4 and the surface-modified region 5 may also be formed on the bottom surface 2b of the insulation substrate 2 through similar steps.

Figure 5:
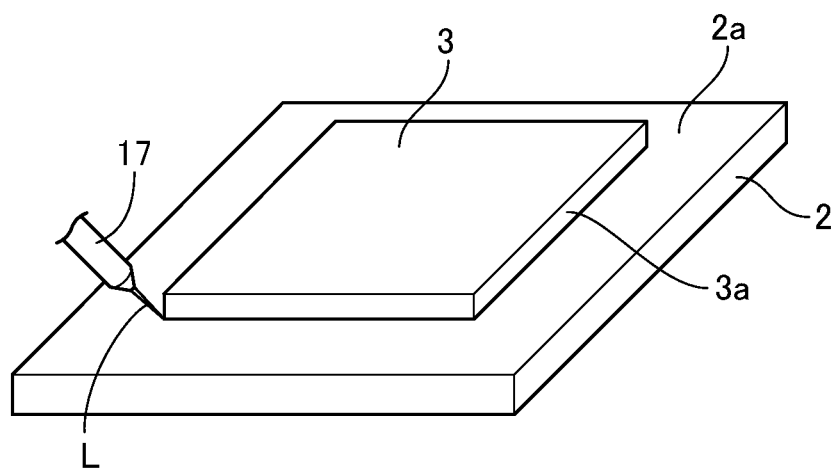
FIG. 5 is a perspective view, as an alternative to FIG. 4A through FIG. 4D, that illustrates steps of producing the laminated substrate of the first embodiment.

FIG. 5 is a perspective view, as an alternative to FIG. 4A through FIG. 4D, that illustrates steps of producing the laminated substrate of the first embodiment. In FIG. 5, the electrode 3 is first formed in a prescribed shape on the top surface 2a of the insulation substrate 2 in FIG. 5. As illustrated in FIG. 5, the electrode 3 is smaller than the top surface 2a of the insulation substrate 2. The laser irradiation device irradiates the top surface 2a of the insulation substrate 2 along an edge 3a of the electrode 3 with laser L as illustrated in FIG. 5. In this process, the top surface 2a of the insulation substrate 2 is irradiated with laser L traveling obliquely with the nozzle 17 of the laser insulation device arranged obliquely. The bottom surface 2b of the insulation substrate 2 receives a similar process. These processes can cause the surface modification to somewhat proceed to the insulation substrate 2 on the bottom surfaces of the electrodes 3 and 4. Thereby, the surface-modified regions are formed in such a manner that they span areas between the bottom surfaces of the electrodes 3 and 4 and peripheries outer than the edges of the electrodes 3 and 4. However, the production steps of FIG. 4A through FIG. 4D can cause the surface modification to reach the bottom surfaces of the electrodes 3 and 4 more reliably and more easily.

Figure 6A:
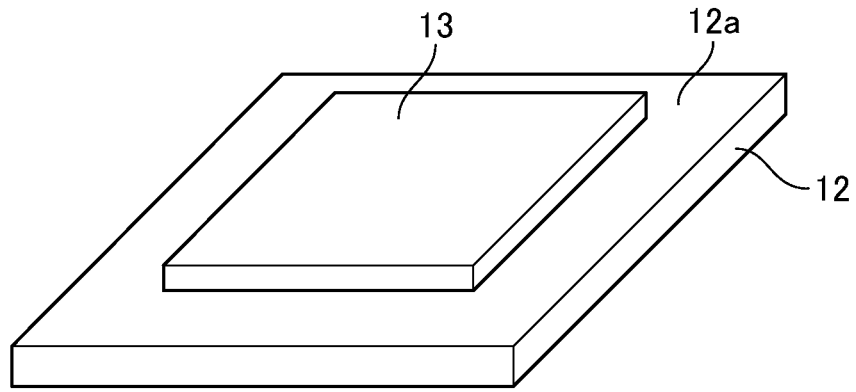
FIG. 6A is a perspective view illustrating steps of producing a laminated substrate of a second embodiment.
Figure 6B:
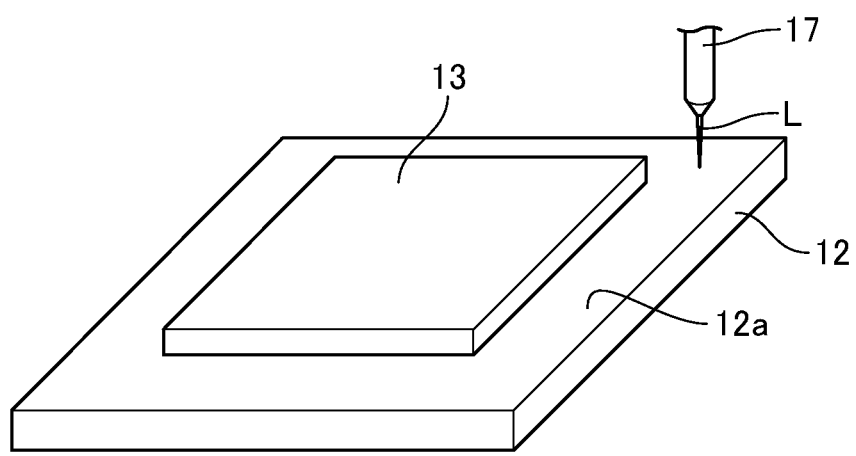
FIG. 6B is a perspective view illustrating the laminated-substrate-production steps subsequent to the steps of FIG. 6A.
Figure 6C:
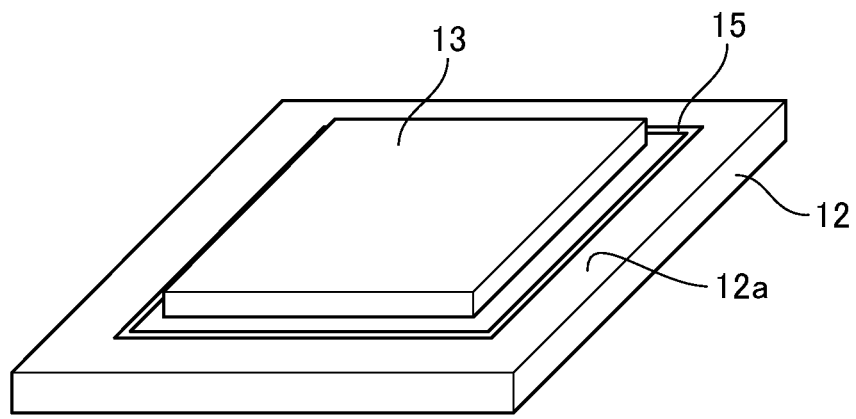
FIG. 6C is a perspective view illustrating the laminated-substrate-production steps subsequent to the steps of FIG. 6B.

Next, the method of producing the laminated substrate of the second embodiment will be explained in order of the steps. FIG. 6A through FIG. 6C are perspective views illustrating steps of producing the laminated substrate of the second embodiment. An electrode 13 is first formed in a prescribed shape on a top surface 12a of an insulation substrate 12 as illustrated in FIG. 6A. The electrode 13 is smaller than the top surface 12a of the insulation substrate 12 as illustrated in FIG. 6A. The electrode 13 is formed by following the steps of FIG. 4C through FIG. 4D. Next, the nozzle 17 of the laser irradiation device is set above a spot separated from the electrode 13 on the top surface 12a of the insulation substrate 12 as illustrated in FIG. 6B, and the top surface 12a of the insulation substrate 12 is irradiated with laser L. As illustrated in FIG. 6C, the laser processing forms a surface-modified region 15 having a shape of a rectangular frame on the top surface 2a of the insulation substrate 2. Desorption of nitrogen (N) and deposition of Al for example occur on the top surface 12a of the insulation substrate 12, which has received the irradiation with laser L. Accordingly, the surface-modified region 15 has conductivity. As illustrated in FIG. 6C, the surface-modified region 15 is not touching the electrode 13 and thus is not electrically connected to it.

While FIG. 6A through FIG. 6C illustrate the steps of forming the electrode 13 and the surface-modified region 15 on the top surface 12a of the insulation substrate 12, the electrode 14 and the surface-modified region 15 may also be formed on the bottom surface 12b of the insulation substrate 12 through similar steps.

Figure 7:
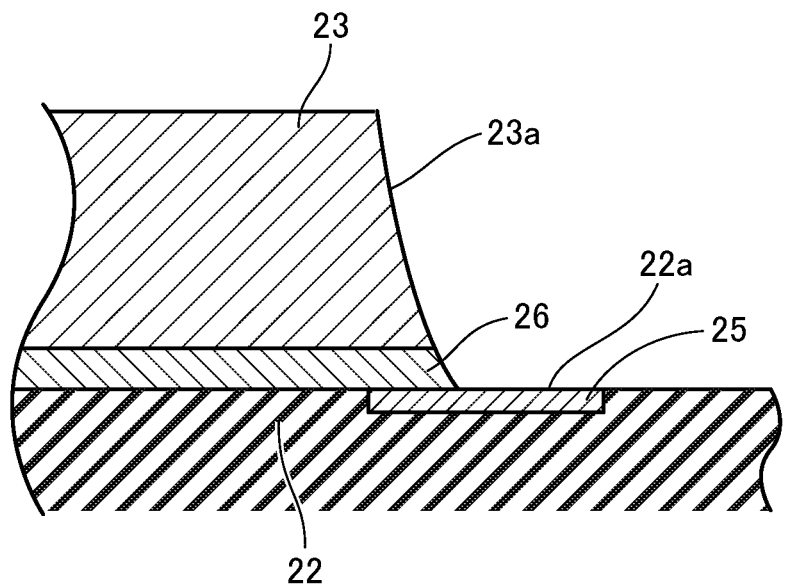
FIG. 7 is a partial cut-portion end view illustrating a laminated substrate of another embodiment.

FIG. 7 is a partial cut-portion end view illustrating a laminated substrate of another embodiment. FIG. 7 illustrates a metallic junction layer 26 between an insulation substrate 22 and an electrode 23. This is for jointing the electrode 23 to a top surface 22a of the insulation substrate 22 via the junction layer 26. The junction layer 26 is for example a brazing material including Ag, Cu, and Ti. An electrode 23 in a prescribed shape obtained by etching a metal plate will have the junction layer 26 that remains somewhat outwardly beyond an edge 23a of the electrode 23 as illustrated in FIG. 7. Note that the etched surface is slanted from the electrode 23 toward the junction layer 26 as illustrated in FIG. 7. The etching often causes a minute groove or hole on the portion of the junction layer 26 that is outwardly extending beyond the edge 23a of the electrode 23. This prevents the encapsulation resin from appropriately entering the minute groove or hole, producing a vacancy. A vacancy is a defect that often causes dielectric breakdown. To address this problem, the top surface 22a of the insulation substrate 22 appearing in FIG. 7 receives laser processing on the outer periphery of the junction layer 26 so as to modify the outer periphery to have electrical conductivity. A surface-modified region 25 appearing in FIG. 7 reaches the bottom surface of the junction layer 26 to be electrically connected to the electrode 23 via the junction layer 26. The laser processing may employ the production steps appearing in FIG. 4 or FIG. 5.

The above processes can outwardly shift triple points, in which three phases overlap to concentrate the electric fields, in a direction in which they get away from a portion with a defect, where dielectric breakdown may originate. This realizes stable production of a laminated substrate with a high dielectric breakdown voltage through a simple scheme. Note that the laser processing may be applied to the top surface 22a of the insulation substrate 22 that is outwardly away from the electrode 23 and the junction layer 26 through the same steps of FIG. 6.

The present embodiment may joint the electrode 23 and the insulation substrate 22 via the junction layer 26 as illustrated in FIG. 7 or may directly joint the electrode 23 and the insulation substrate 22. Further, the bottom surface of the insulation substrate 22 may also receive the laser processing through the same steps of FIG. 7. A semiconductor module can be produced by using a laminated substrate with a high dielectric breakdown voltage resulting from the above processes.

Figure 8:
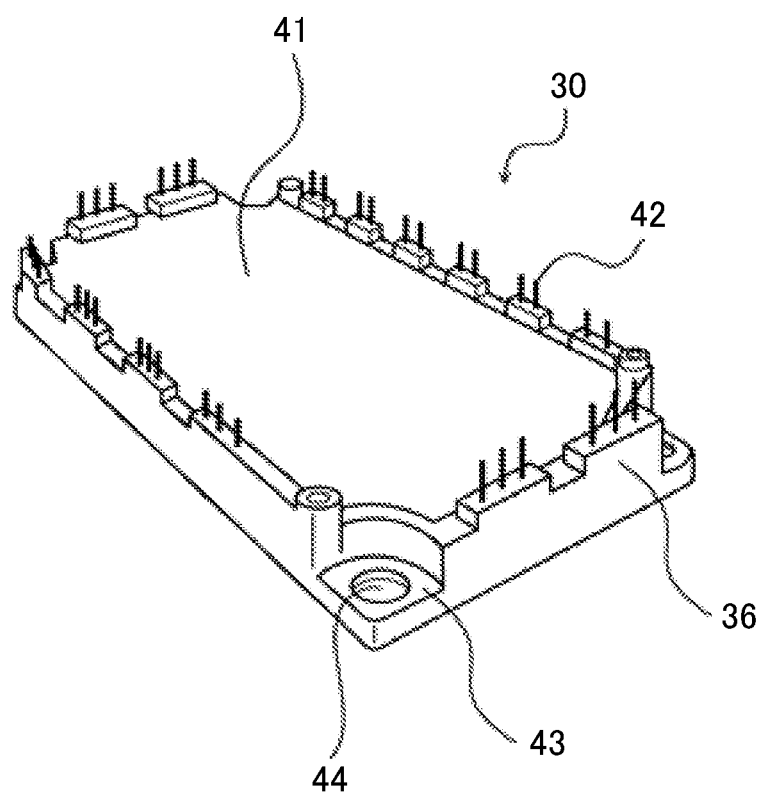
FIG. 8 is a perspective view illustrating a semiconductor module of the present embodiment.
Figure 9:
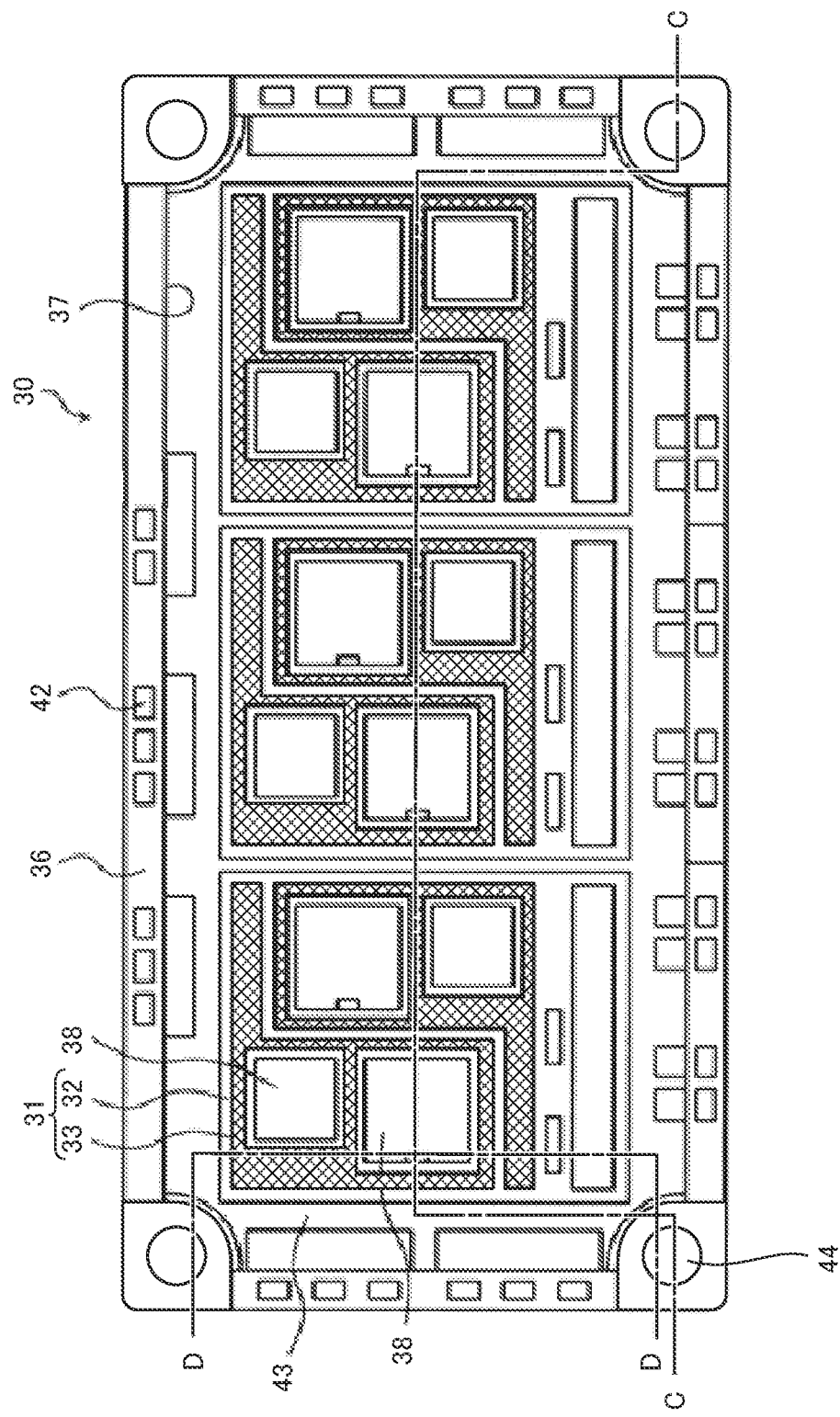
FIG. 9 is a plan view illustrating the semiconductor module of the present embodiment.
Figure 10:
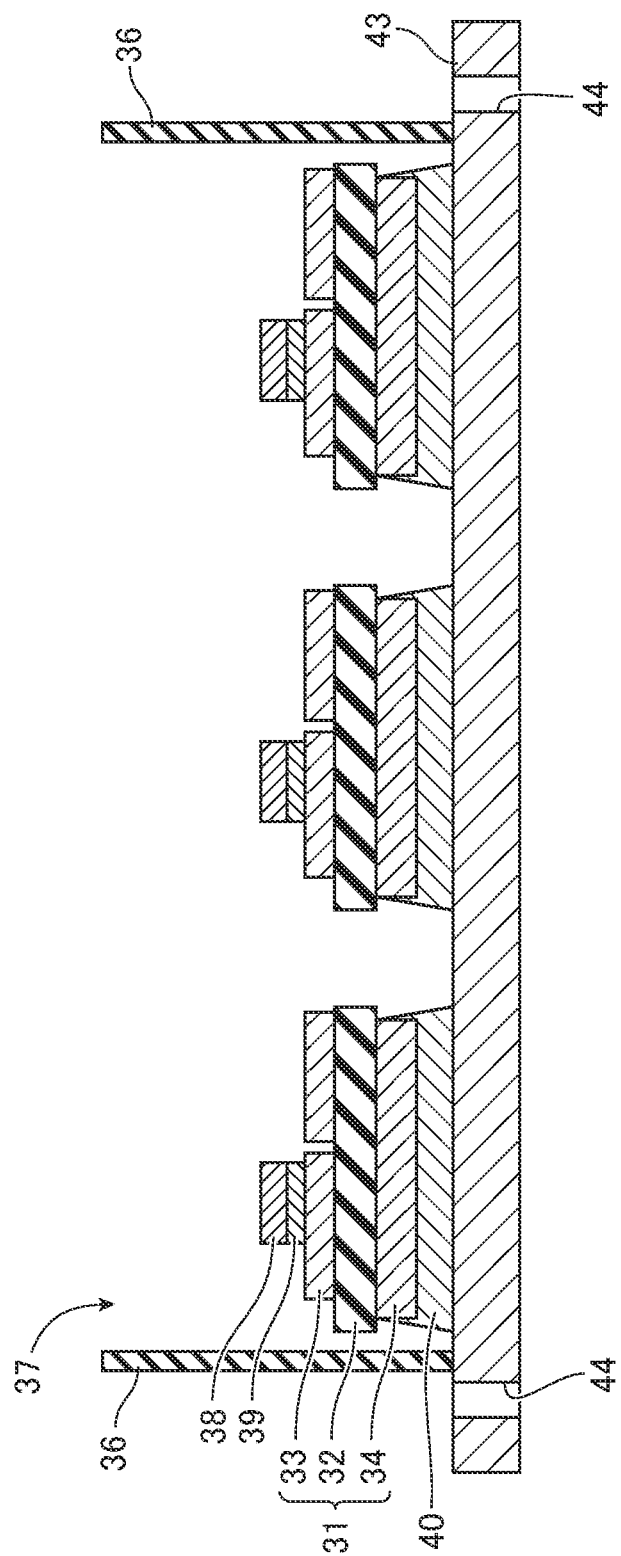
FIG. 10 is a cut-portion end view illustrating the end surface resulting from cutting the semiconductor module along line C-C of FIG. 9.
Figure 11:
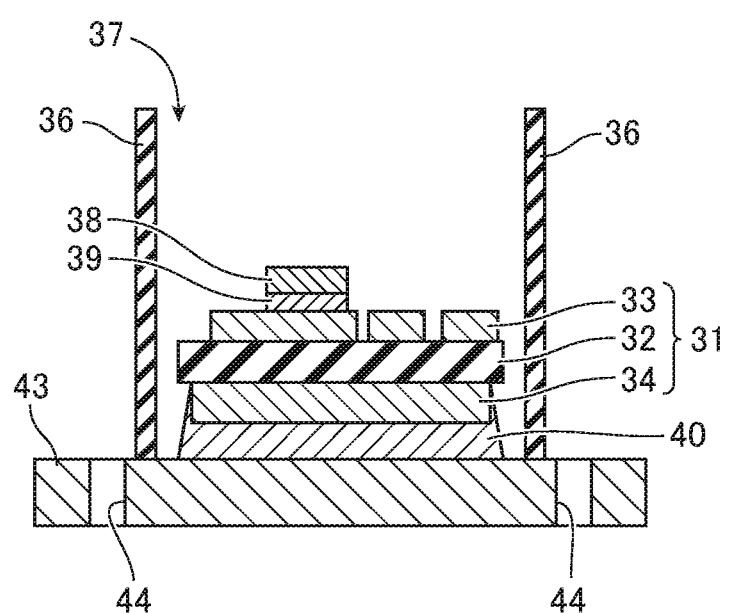
FIG. 11 is a cut-portion end view illustrating the end surface resulting from cutting the semiconductor module along line D-D of FIG. 9.

FIG. 8 is a perspective view of a semiconductor module of the present embodiment. FIG. 9 is a plan view illustrating the semiconductor module of the present embodiment. FIG. 10 is a cut-portion end view illustrating the end surface resulting from cutting the semiconductor module along line C-C of FIG. 9. FIG. 11 is a cut-portion end view illustrating the end surface resulting from cutting the semiconductor module along line D-D of FIG. 9. Note that FIG. 9 through FIG. 11 are a plan view and cut-portion end views illustrating the semiconductor module in a state in which it does not have a lid 41 of FIG. 8 or the encapsulation resin. The double-hatched areas represent circuit boards in FIG. 9. The illustrations of FIG. 8 through FIG. 11 may be in different scales for the convenience of explanations.

Note that the laminated substrates appearing in FIG. 1 through FIG. 7 are schematically illustrated for clarifying the features of the present embodiment. FIG. 9 through FIG. 11 illustrate an exemplary structure of a laminated substrate that is to be used for the semiconductor module. FIG. 9 through FIG. 11, however, omits surface-modified regions obtained through laser processing for the simplicity of the illustration. The surface-modified region will be detailed in FIG. 12. Further, FIG. 9 through FIG. 11 omit constituents such as for example electronic components other than the semiconductor element, wiring members including a wire and a lead frame, and an encapsulation resin.

A semiconductor module 30 is a package containing a plurality of semiconductor elements 38, where a housing portion 37, segmented by a base plate 43 and a case 36, houses laminated substrates 31 having the semiconductor elements 38 mounted on them.

The laminated substrates 31 of FIG. 10 and FIG. 11 each include an insulation substrate 32 comprising ceramic, circuit boards 33 formed on the top surface of the insulation substrate 32, and a metal plate 34 formed on the bottom surface of the insulation substrate 32. The circuit boards 33 and the metal plates 34 are equivalent to "electrodes" of the present embodiment. Principal currents applied through connection terminals 42 pass through the circuit boards 33 and are input to the semiconductor elements 38. Thereby, the circuit boards 33 have high potential. This results in high voltage between the circuit boards 33 and between the circuit boards 33 and the metal plates 34.

The method of producing the semiconductor module of the present embodiment will be explained. As illustrated in FIG. 10 and FIG. 11, a plurality of semiconductor elements 38 are jointed to the circuit boards 33 via soldering layers 39. The metal plates 34 formed on the bottom surfaces of the insulation substrates 32 are jointed to the base plate 43, which is for example copper plates, via soldering layers 40. This permits the heat conduction from the semiconductor elements 38 to the base plate 43 via the laminated substrates 31. Note that the circuit boards 33 of the laminated substrates 31 have, mounted thereon, various types of electronic components and wiring members in addition to the semiconductor elements 38.

The laminated substrates 31 and the semiconductor elements 38 housed by the housing portion 37 may be covered with an encapsulation resin although this is not illustrated. The encapsulation resin may be single layered or multi layered. A multi-layer encapsulation resin may use one material for all the layers or may use different materials for different layers. The lid 41 appearing in FIG. 8 is jointed to the encapsulation resin. The leads of the connection terminals 42 are extending from the case 36 as illustrated in FIG. 8 and FIG. 9 of this embodiment. Also, the base plate 43 has through holes 44. These through holes 44 allow the insertion of screws such as bolts etc. to fix the semiconductor module to an external heat dissipation fin device or a water-cooling jacket, etc.

The semiconductor element 38 uses a material substance such as for example silicon (Si) and silicon carbide (SiC). Examples of the semiconductor elements 38 include a switching element such as an insulted-gate bipolar transistor (IGBT), a power metal-oxide semiconductor field effect transistor (power MOSFET), etc. These types of the semiconductor element 38 include for example a drain electrode (or collector electrode) as the main electrode on its bottom surface and includes a gate electrode and a source electrode (or emitter electrode) as the main electrodes on its top surface. The "top surface" refers to the surface on the side having the leads of the connection terminals 42 extending from the case 36. The "bottom surface" refers to the surface on the side that is opposite from the "top surface" and that has the base plate 43. The semiconductor element 38 also includes a diode such as for example a schottky barrier diode (SBD), a free wheeling diode (FWD) as needed. This type of the semiconductor element 38 includes cathode and anode electrodes as the main electrodes respectively on the bottom and top surfaces.

Figure 12A:
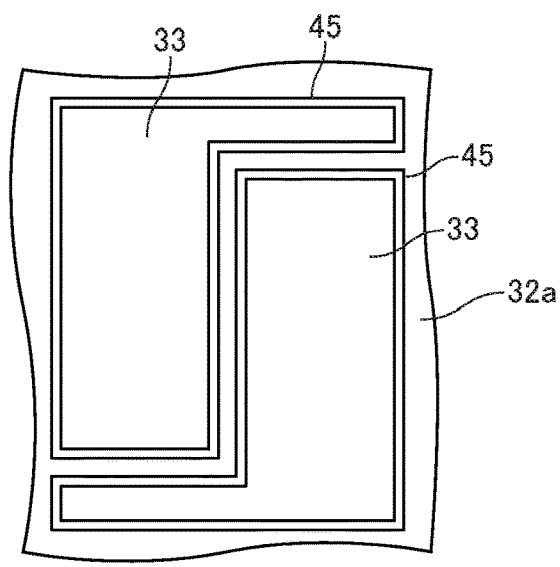
FIG. 12A is an enlarged partial plan view of a laminated substrate illustrating an example of laser processing.
Figure 12B:
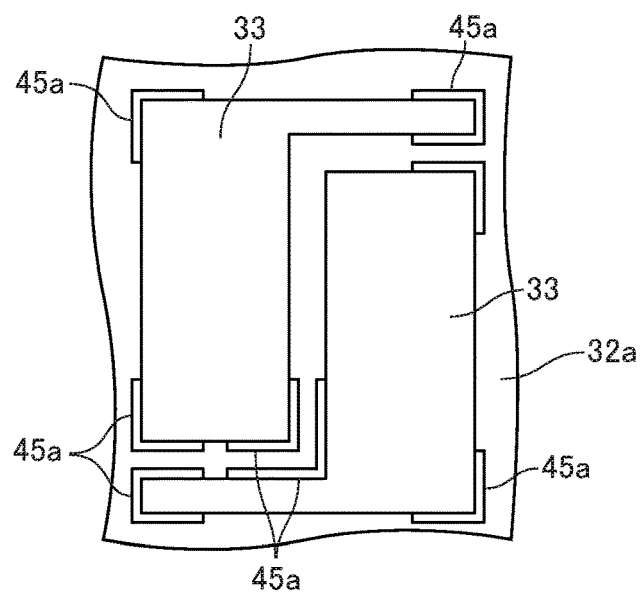
FIG. 12B is an enlarged partial plan view of a laminated substrate illustrating an example of laser processing.
Figure 12C:
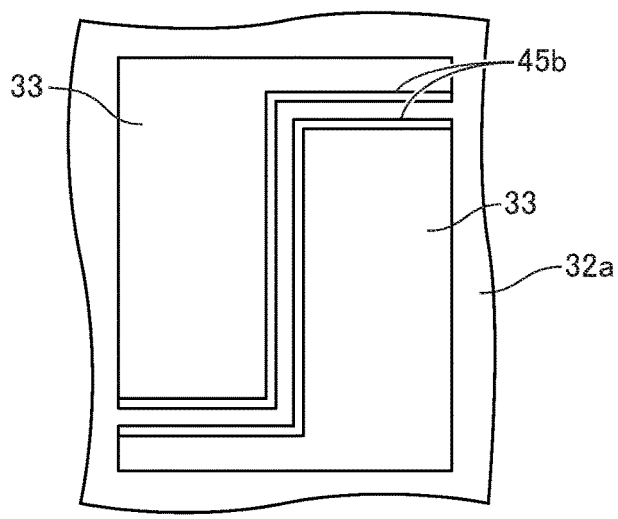
FIG. 12C is an enlarged partial plan view of a laminated substrate illustrating an example of laser processing.

FIG. 12A through FIG. 12C are enlarged partial plan views of a laminated substrate illustrating an example of laser processing. FIG. 12A through FIG. 12C illustrate a pair of the circuit boards 33 provided on the laminated substrate 31 of FIG. 9 with the semiconductor elements 38 on the circuit boards 33 omitted. A top surface 32a of the insulation substrate 32 receives laser processing entirely on the outer peripheries of the circuit boards 33 in FIG. 12A. This results in surface-modified regions 45 formed on the entire peripheries of the circuit boards 33 on the top surface 32a of the insulation substrate 32. The formation of the surface-modified regions may employ any methods explained in FIG. 4 through FIG. 7.

In FIG. 12B and FIG. 12C, some portions of the peripheries of the circuit boards 33 have surface-modified regions 45a and 45b formed in them. As described above, surface-modified regions do not have to be formed entirely on the outer peripheries of the circuit boards 33. For example, the surface-modified regions 45a may be formed only at the corners of the circuit boards 33 as illustrated in FIG. 12B. Further, the surface-modified regions 45b may be formed only along the inner edges of the circuit boards 33 facing each other as illustrated in FIG. 12C. However, FIG. 12B and FIG. 12C just illustrate exemplary positions for the formation of surface-modified regions. Performing the surface modification preferentially on a portion having a lower dielectric breakdown voltage, if detected beforehand, on the peripheries of the circuit boards 33 on the top surface 32a of the insulation substrate 32 will increase that dielectric breakdown voltage.

The bottom surface of the insulation substrate 32 is also preferably to receive laser processing to have electrical conductivity through the surface modification on the outer periphery of the metal plate 34. The surface modification on this bottom surface may be performed on the entire periphery of the metal plate 34 or may be performed on part of the periphery.

The present embodiment is not limited to the above embodiments or variation examples, but allows various modifications, substitutions, and alterations without departing from the spirit of the technical concept. Further, the present embodiment may be implemented in any other forms based on a potential technical advance or based on a derivative technique that can embody the technical concept. The scope of the claims, therefore, encompasses all embodiments that can fall within the scope of the technical concept.

The following lists the features of the above embodiments. The method, according to the above embodiment, of producing a laminated substrate is a method of producing a laminated substrate that includes an insulation substrate, comprising ceramic, and an electrode formed on a top surface of the insulation substrate and that permits a semiconductor element to be mounted on the top surface of the electrode, the method including applying laser processing to an outer periphery of the electrode on the top surface of the insulation substrate so as to conduct surface modification to modify the outer periphery to have electrical conductivity. This configuration realizes stable production of a laminated substrate having a high dielectric breakdown voltage through a simple scheme of laser processing without changing the encapsulation structure etc. Also, the surface modification uses the laser used for cutting the insulation substrate, thereby reducing the cost.

In the method of producing a laminated substrate according to the embodiment, the insulation substrate preferably comprises ceramic whose principal component is aluminum nitride. This permits stable production of a laminated substrate having a high dielectric breakdown voltage in a more preferable manner.

In the method of producing a laminated substrate according to the embodiment, the laser processing may be applied in such a manner that the surface modification reaches a bottom surface of the electrode. The surface-modified region formed on the top surface of the insulation substrate outwardly extends beyond the edge of the electrode from the bottom surface of the electrode. This configuration can outwardly shift triple points in a direction in which they get away from the edge of an electrode that tends to be subject to a defect such as a pit etc. This configuration also permits stable increase of the dielectric breakdown voltage.

In the method of producing a laminated substrate according to the embodiment, a portion separated from the electrode on the top surface of the insulation substrate may receive laser processing. Thereby, a floating potential can be provided on the outside of an electrode, mitigating the concentration of electric fields in a triple point. This configuration permits stable increase of the dielectric breakdown voltage.

In the method of producing a laminated substrate according to the embodiment, the laser processing may be applied prior to formation of the electrode on the top surface of the insulation substrate. This configuration makes it possible to first form a surface-modified region through laser processing so as to later form an electrode so that the electrode overlaps part of the surface-modified region. Thereby, the surface-modified region can be formed in such a manner that it spans an area between the bottom surface of an electrode and a portion outer than the edge of the electrode in a simple manner.

In the method of producing a laminated substrate according to the embodiment, the laser processing may be applied after formation of the electrode on the top surface of the insulation substrate. This configuration permits a simple scheme in which laser processing is applied to the top surface of an insulation substrate exposed to the outside of an electrode. In particular, laser processing can easily and reliably be applied to a spot separated from an electrode on the top surface of an insulation substrate.

In the method of producing a laminated substrate according to the embodiment, an entire outer periphery of the electrode may receive laser processing. While the present embodiment includes an example in which laser processing is partially applied to a periphery of an electrode on the top surface of an insulation substrate, applying laser processing to the entire periphery increases the dielectric breakdown voltage more stably.

In the method of producing a laminated substrate according to the embodiment, a metallic junction layer outwardly extending beyond the electrode exists between the insulation substrate and the electrode. Also, the top surface of the insulation substrate receives laser processing on an outer periphery of the metallic junction layer. This can outwardly shift triple points in a direction in which they get away from the edges of electrodes and a junction layer that tend to be subject to a defect. This alternatively can lead to formation of a conductive surface-modified region at a position outwardly distant from the edges of electrodes and a junction layer, which tend to be subject to a defect. Thereby, the dielectric breakdown voltage can stably be increased through a simple scheme.

In the method of producing a laminated substrate according to the embodiment, each of the top surface and the bottom surface of the insulation substrate includes the electrode, and each of the top surface and the bottom surface of the insulation substrate receives laser processing. As described above, applying laser processing to not only the top surface but also the bottom surface of the insulation substrate can increase the dielectric breakdown voltage more stably.

Note that laser processing is applied at least to the top surface of the insulation substrate on which a semiconductor element is mounted in the present embodiment. In other words, the laser processing does not have to be applied to the bottom surface of an insulation substrate in an embodiment in which no electrode is formed on the bottom surface of an insulation substrate or in an embodiment in which an electrode almost as large as the bottom surface of the insulation substrate is formed. In an embodiment in which an electrode smaller than the bottom surface of the insulation substrate is formed to expose part of the bottom surface of the insulation substrate, laser processing is preferably applied to the bottom surface of the insulation substrate similarly to the top surface of the insulation substrate.

A method, according to the present embodiment, of producing a semiconductor module includes mounting a semiconductor element on the laminated substrate produced by the above methods, according to the above embodiments, of producing a laminated substrate. The present embodiment permits use of a highly-stable laminated substrate with a high dielectric breakdown voltage so as to produce a semiconductor module, leading to production of highly-reliable semiconductor modules.

Also, a laminated substrate according to the above embodiment is a laminated substrate that includes an insulation substrate, comprising ceramic, and an electrode formed on a top surface of the insulation substrate and that permits a semiconductor element to be mounted on the top surface of the electrode, the laminated substrate including a surface-modified region whose principal component is a metal or an alloy made of metal elements constituting the ceramic, the surface-modified region being located on an outer periphery of the electrode on the top surface of the insulation substrate. The laminated substrate of the present embodiment stably achieves a higher dielectric breakdown voltage.

In the laminated substrate according to the embodiment, the insulation substrate is preferably ceramic whose principal component is aluminum nitride and a principal component of the surface-modified region is preferably a metal comprising aluminum. This configuration permits formation of a highly-conductive surface-modified region on the top surface of the insulation substrate.

In the laminated substrate according to the embodiment, the surface-modified region may reach a bottom surface of the electrode. This causes an electric connection between the surface-modified region and the electrode, outwardly shifting the triple points in a direction in which they get away from the edge of the electrode that tends to be subject to a defect such as a pit etc. This permits stable increase of the dielectric breakdown voltage.

In the laminated substrate according the embodiment, the surface-modified region may be in a portion separated from the electrode on the top surface of the insulation substrate. Thereby, the outside of the electrode is provided with a floating potential, mitigating the concentration of electric fields in the triple points. This permits stable increase of the dielectric breakdown voltage.

In the laminated substrate according to the embodiment, the surface-modified region may be over an entire outer periphery of the electrode. This permits stable increase of the dielectric breakdown voltage.

In the laminated substrate according to the embodiment, a metallic junction layer outwardly extending beyond the electrode exists between the insulation substrate and the electrode. Also, the surface-modified region may be on an outer periphery of the metallic junction layer on the top surface of the insulation substrate. This can outwardly shift the triple points in a direction in which they get away from the edge of an electrode and a junction layer that tend to be subject to a defect. This alternatively leads to formation of a surface-modified region at a position outwardly distant from the edges of electrodes and a junction layer, which tend to be subject to a defect. Thereby, the dielectric breakdown voltage can stably be increased.

In the laminated substrate according to the embodiment, the electrode is provided on each of the top surface and the bottom surface of the insulation substrate, and the surface-modified region is formed on each of the top surface and the bottom surface of the insulation substrate. As described above, forming surface-modified regions not only on the top surface but also the bottom surface of the insulation substrate leads to more stable increase of the dielectric breakdown voltage.

In the semiconductor module according to the embodiment, the semiconductor element is mounted on the laminated substrate according to the above embodiments. The present embodiment permits use of a highly-stable laminated substrate with a high dielectric breakdown voltage so as to produce a semiconductor module, leading to provision of highly-reliable semiconductor modules.

EXPLANATIONS OF LETTERS OR NUMERALS

1, 11, 31: LAMINATED SUBSTRATE
2, 12, 22, 32: INSULATION SUBSTRATE
3, 4, 13, 14, 23: ELECTRODE
5, 15, 25, 45, 45A, 45B: SURFACE-MODIFIED REGION
17: NOZZLE
18: METAL PLATE

26: JUNCTION LAYER
30: SEMICONDUCTOR MODULE
33: CIRCUIT BOARD
34: METAL PLATE
36: CASE
37: HOUSING PORTION
38: SEMICONDUCTOR ELEMENT
39, 40: SOLDERING LAYER
41: LID
42: CONNECTION TERMINAL
43: BASE PLATE
44: THROUGH HOLE
L: LASER

What is claimed is:

1. A method of manufacturing a laminated substrate including an insulation substrate comprised of ceramic, and a front electrode formed on a front surface of the insulation substrate, a semiconductor element being mountable on a front surface of the front electrode, the method comprising:
forming the front electrode on the front surface of the insulation substrate; and
before or after the forming the front electrode, laser processing the front surface of the insulation substrate to modify a conductive property of the front surface of the insulation substrate to have electrical conductivity, thereby forming a modified region along an outer peripheral area of the front electrode, wherein
the modified region extends outwardly from an edge of the front electrode, and inwardly beneath the front electrode.

2. The method of manufacturing a laminated substrate according to claim 1, wherein the insulation substrate is comprised of ceramic containing aluminum nitride as a major component.

3. The method of manufacturing a laminated substrate according to claim 1, wherein the laser processing includes forming the modified region along an entire outer periphery of the front electrode.

4. The method of manufacturing a laminated substrate according to claim 1, further comprising
forming a rear electrode on a rear surface of the insulation substrate,
before or after the forming the rear electrode, laser processing the rear surface of the insulation substrate at an outer peripheral area of the rear electrode to modify a conductive property of the rear surface of the insulation substrate to have electrical conductivity.

5. A method of manufacturing a semiconductor module, the method comprising
mounting a semiconductor element on the laminated substrate manufactured by the method according to claim 1.

6. The method of manufacturing a laminated substrate according to claim 1, wherein the modified region surrounds an entire outer periphery of the front electrode.

7. The method of manufacturing a laminated substrate according to claim 1, wherein the modified region is exposed from the front surface of the laminated substrate.

8. The method of manufacturing a laminated substrate according to claim 1, wherein the front electrode comprises a metal plate that is joined to the insulation substrate.

9. A method of manufacturing a laminated substrate including an insulation substrate comprised of ceramic, and a front electrode formed on a front surface of the insulation substrate, a semiconductor element being mountable on a front surface of the front electrode, the method comprising:
forming the front electrode on the front surface of the insulation substrate; and
before or after the forming the front electrode, laser processing the front surface of the insulation substrate to modify a conductive property of the front surface of the insulation substrate to have electrical conductivity, thereby forming a modified region along an outer peripheral area of the front electrode, wherein
the laser processing includes forming the modified region so as to be spaced apart from an outer surface of the front electrode and electrically disconnected from the front electrode.

10. The method of manufacturing a laminated substrate according to claim 9, wherein the laser processing is applied before the forming the front electrode on the front surface of the insulation substrate.

11. The method of manufacturing a laminated substrate according to claim 9, wherein the laser processing is applied after the forming the front electrode on the front surface of the insulation substrate.

12. A method of manufacturing a laminated substrate including an insulation substrate comprised of ceramic, and a front electrode formed on a front surface of the insulation substrate, a semiconductor element being mountable on a front surface of the front electrode, the method comprising:
forming the front electrode on the front surface of the insulation substrate; and
before or after the forming the front electrode, laser processing the front surface of the insulation substrate to modify a conductive property of the front surface of the insulation substrate to have electrical conductivity, thereby forming a modified region along an outer peripheral area of the front electrode, wherein
forming the front electrode includes forming the front electrode on the front surface of the insulation substrate via a metallic junction layer, the metallic junction layer outwardly extending from a surface of the front electrode, and
the laser processing is applied to the front surface of the insulation substrate at an outer peripheral area of the metallic junction layer.

* * * * *